United States Patent [19]

Beris et al.

[11] Patent Number: 4,594,961
[45] Date of Patent: Jun. 17, 1986

[54] STAMP AND DEVICE FOR PROVIDING DROPS OF A VISCOUS LIQUID ON A SUBSTRATE

[75] Inventors: Petrus J. M. Beris; Jan J. Wondergem; Hendrik J. Vledder, all of Eindhoven, Netherlands

[73] Assignee: U.S. Philips Corporation, New York, N.Y.

[21] Appl. No.: 676,116

[22] Filed: Nov. 29, 1984

[30] Foreign Application Priority Data

Dec. 6, 1983 [NL] Netherlands .................. 8304185

[51] Int. Cl.$^4$ .............................................. B05C 1/02
[52] U.S. Cl. ................................ 118/212; 118/221; 118/225; 118/263
[58] Field of Search ............. 118/243, 263, 211, 212, 118/221, 225

[56] References Cited

U.S. PATENT DOCUMENTS

| | | | |
|---|---|---|---|
| 1,293,147 | 2/1919 | McMurray | 118/243 |
| 2,816,755 | 12/1957 | Dusenbury et al. | 118/243 X |
| 2,902,002 | 9/1959 | Argyle | 118/243 |

Primary Examiner—John P. McIntosh
Attorney, Agent, or Firm—David R. Treacy

[57] ABSTRACT

A form of stamp in which a height/diameter ratio of a drop of glue can be achieved which is larger than one fifth, for providing drops of glue on printed circuit boards or components in assembling electrical chip components. A projection having a height between one-tenth and one-half the largest stamp end face dimension, and a cross section less than one-quarter the end face area, projects from the center of the end face. These stamps reduce the effect of machine stoppage on the shape and dimension of the drops of glue.

12 Claims, 4 Drawing Figures

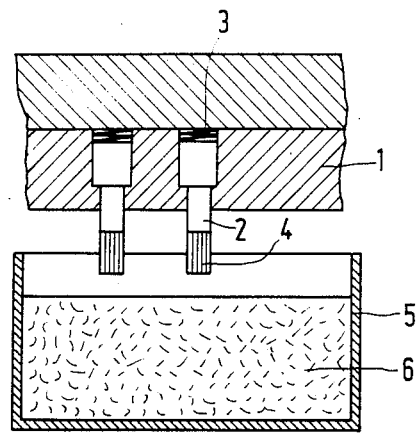
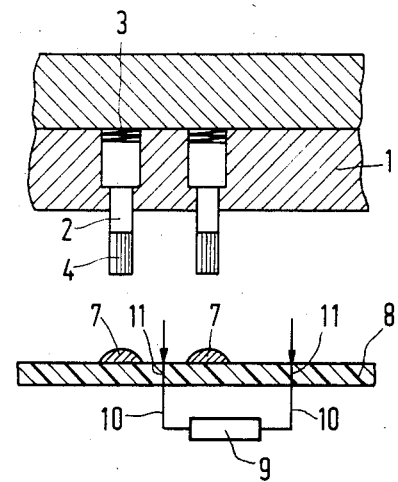
FIG.1a
PRIOR ART
FIG.1b
PRIOR ART
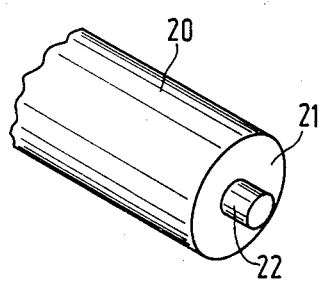
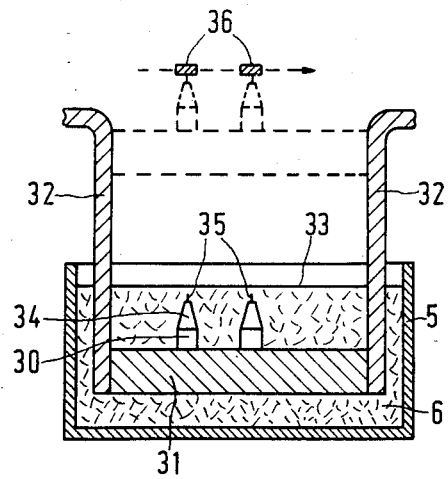
FIG.2
FIG.3

STAMP AND DEVICE FOR PROVIDING DROPS OF A VISCOUS LIQUID ON A SUBSTRATE

BACKGROUND OF THE INVENTION

The invention relates to a stamp for providing a drop of a viscous liquid on a substrate, the stamp comprising an end face for picking up and giving off the drop.

The invention moreover relates to a device for simultaneously providing one or more drops of a viscous liquid, in particular for providing drops of glue, on a printed circuit board or on electronic components without connection wires, the device comprising one or more stamps which are resiliently provided in apertures in a plate.

A device for providing drops of glue on a printed circuit board or on electronic components without connection wires is described, for example, in U.S. Patent Specification U.S. Pat. No. 4,375,126, column 8, line 54 to column 9, line 44 inclusive. This device comprises stamps having cylindrical stamp portions which consist of an elastic material. The cross-section of the stamp portions is of the same order of magnitude as the dimensions of the electronic components without connection wires in the form of a plate or block, i.e. a few millimetres. A usual size of the components to be glued is 1.6×3.2 millimetres. In view of the small dimensions of the components and in view of the dense pattern of tracks on a printed circuit board, the drops of glue and the components must be positioned accurately with respect to the tracks on the substrate. It is therefore desired to provide the required quantity of glue on an area which is as small as possible.

SUMMARY OF THE INVENTION

It is the object of the invention to provide a stamp with which drops of glue can be provided which have a small diameter and a comparatively large height, the ratio of height to diameter being, for example, more than one fifth.

According to the invention this object is achieved by providing the end face of the stamp with a projection, the cross-sectional area of which is less than one quarter of the area of the end face and the height of which is more than one tenth and less than half the largest dimension of the end face.

The invention is based on the recognition of the fact that the height of the drop of glue can be increased by ensuring that the end face of the stamp is kept at some distance from the substrate by means of a projection. As a result of the small cross-section of the projection, the quantity of glue in the drop is hardly reduced. The quantity of glue in the drop is therefore largely determined by the area of the end face of the stamp.

An additional advantage of the use of stemps according to the invention in a device for simultaneously providing several drops proves to be that the drops, when starting the device after machine stoppage, reach the desired dimensions after only a few cycles.

Another additional advantage is that drops of different sizes which are provided simultaneously in one stamping operation after dipping with a dipping depth which is equal for all stamps, can each individually obtain optimum dimensions by adapting the dimensions of the stamp and of the projection for the different drops to be provided.

A projection according to the invention may be used in cylindrical stamps, but also, for example, in conical stamps or in stamps having a rectangular end face.

In a preferred embodiment of a stamp in accordance with the invention, the end face is circular.

In a further embodiment of a stamp in accordance with the invention, the ratio between the height of the projection and the diameter of the circular end face is more than one fifth and less than one half.

In a suitable embodiment of a stamp in accordance with the invention, the projection is cylindrical.

A symmetrical shape of the provided drop can be achieved if the projection is in the centre of the end face.

The invention will be described in greater detail with reference to the accompanying drawing.

BRIEF DESCRIPTION OF THE DRAWING

FIG. 1a is a cross-sectional view of a part of a prior art device,

FIG. 1b is a cross-sectional view of a part of a prior art device placed opposite a printed circuit board, FIG. 2 is a perspective view of a stamp with projection according to the invention, and FIG. 3 is a cross-sectional view of a possible embodiment of a device according to the invention.

DESCRIPTION OF THE PREFERRED EMBODIMENTS

Description of a prior art device

FIG. 1a shows a plate 1 comprising stamps 2 which are provided so as to be movable and are loaded by springs 3. The stamps 2 comprise stamp portions 4 which consist of an elastic material. The stamps are dipped in a glue container 5 containing down to a prescribed depth a, for example, thermo-hardening, glue 6, as a result of which an accurately determined quantity of glue 6 is transferred to the stamp portions 4.

FIG. 1b shows the plate 1 with stamps 2 after drops 7 of glue have been transferred to desired positions on a printed circuit board 8. Optionally, conventional electronic components 9 which are connected to the printed circuit board 8 by means of connection wires 10 via lead-throughs 11, may be present on said printed circuit board 8. A translation device, (not shown in FIG. 1b) ensures that the stamp portions 4 are pressed against the substrate, in this case the printed circuit board 8. The resilient connection of the stamps 2 in the plate 1 enables a simultaneous contact of all stamps with the substrate, even if the substrate is not entirely smooth. As a result of the elastic character of the stamp portions 4, some deformation and positional inaccuracy may occur. The ratio of the height to the diameter of the placed drop of glue is approximately one tenth.

Description of a stamp and device according to the invention

FIG. 2 shows (not to scale) a stamp 20 having a body with an end face 21 and a projection 22 according to the invention. The stamp shown in FIG. 2 is cylindrical but this is not essential for the invention. The height of the projection 22 is preferably one fifth to half the diameter of the end face 21. The cross-sectional area of the projection 22 is preferably less than one quarter of the area of the end face 21. The sizes to be chosen eventually depend on the rheological properties of the glue, on the size of the drop to be provided, and on the depth of dipping. The minimum cross-section of the projection is determined by the mechanical load and the strength of the material of the projection. In practice, when stainless steel is used, a minimum diameter of 0.2 mm has proved to be suitable. Suitable sizes for a cylindrical stamp are, for example: diameter of the stamp 1.5 mm, diameter of the projection 0.5 mm, height of the projection 0.4 mm. With these dimensions it is achieved that a drop of a glue having a viscosity between 10 and 100 Pa.s obtains a ratio height/diameter of more than one fifth.

A stamp according to the invention may consist entirely of metal, for example stainless steel. The projection can be produced, for example, by turning off (machining) to the desired diameter.

FIG. 3 shows an embodiment of a device in accordance with the invention in which the stamps 30 and the plate 31 are present in the glue 6 in the glue container 5. The plate 31 can be moved upwards with the stamps 30 via guides 32 so that the bodies or stamp portions 34 each comprising a projection 35 take along a quantity of glue 6. The glue 6 may be provided, for example, on components 36 without contact wires which, via a transport system (not shown in FIG. 3) are supplied from a stock and which, after being provided with a drop of glue, are transported to a printed circuit board for connection. In an alternative embodiment of a device in accordance with the invention, the drops of glue may also be provided in the desired pattern on the printed circuit board.

Stamps according to the invention may also be used in an embodiment of a device in which the stamps are dipped in glue as described hereinbefore in a prior art device. The invention has been described in applications for providing glue on electronic components without contact wires and on printed circuit boards. However, the principle of the invention may also be applied to stamps for providing other viscous liquids, for example soldering pastes, conductor pastes and conductive glues.

What is clamied is:

1. A stamp for providing a drop of a viscous liquid on a substrate, said stamp comprising a body having an end face having a given cross-section and largest dimension selected for picking up and giving off the drop, the quantity of liquid in the drop being determined largely by the area of the face cross-section, characterized in that the end face has a projection, said projection having a cross-sectional area which is less than one-quarter the area of the end face, and a height which is more than one-tenth and less than half said largest dimension.

2. A stamp as claimed in claim 1, characterized in that the end face is circular.

3. A stamp as claimed in claim 2, characterized in that the ratio of the height of the projection to the diameter of the circular end face is more than one fifth and less than one half.

4. A stamp as claimed in claim 3, characterized in that the projection is cylindrical.

5. A stamp as claimed in claim 4, characterized in that the projection is in the center of the end face.

6. A stamp as claimed in claim 1, characterized in that the projection is in the center of the end face.

7. A stamp as claimed in claim 1, characterized in that the projection is cylindrical.

8. A device for simultaneously providing at least one drop of a viscous liquid onto an element, comprising:
   a stamp comprising a body having an end face having a given cross-section and largest dimension,
   a plate in which said stamp is resiliently mounted, and
   means for bringing at least said face into contact with a quantity of glue, and transferring a drop of glue taken along on said face to said element, the quantity of glue in said drop being determined largely by the area of the face cross-section,
   characterized in that the end face has a projection, said projection having a cross-sectional area which is less than one-quarter the area of the end face, and a height which is more than one-tenth and less than half said largest dimension.

9. A device as claimed in claim 8, characterized in that said end face is circular.

10. A device as claimed in claim 9, characterized in that the ratio of the height of the projection to the diameter of the circular end face is more than one-fifth and less than one-half.

11. A device as claimed in claim 10, characterized in that said projection is a cylinder projecting perpendicularly from and at the center of said end face.

12. A device as claimed in claim 8, characterized in that said projection is a cylinder projecting perpendicularly from and at the center of said end face.

* * * * *